United States Patent
Wu

(10) Patent No.: US 9,788,435 B2
(45) Date of Patent: Oct. 10, 2017

(54) COMPOSITE SUBSTRATE SENSOR DEVICE AND METHOD OF MANUFACTURING SUCH SENSOR DEVICE

(71) Applicant: Mei-Yen Lee, Hsin Chu (TW)

(72) Inventor: Hsien-Ming Wu, Taoyuan (TW)

(73) Assignee: Mei-Yen Lee, Hsin Chu (TW)

( * ) Notice: Subject to any disclaimer, the term of this patent is extended or adjusted under 35 U.S.C. 154(b) by 0 days.

(21) Appl. No.: 15/096,621

(22) Filed: Apr. 12, 2016

(65) Prior Publication Data
US 2016/0305998 A1    Oct. 20, 2016

(30) Foreign Application Priority Data

Apr. 14, 2015 (TW) .............................. 104111876 A
Oct. 13, 2015 (TW) .............................. 104133458 A

(51) Int. Cl.
*G01R 29/12* (2006.01)
*H05K 3/10* (2006.01)
(Continued)

(52) U.S. Cl.
CPC .............. *H05K 3/10* (2013.01); *G06F 3/044* (2013.01); *G06K 9/0002* (2013.01); *H01L 23/5389* (2013.01); *H01L 2224/04105* (2013.01)

(58) Field of Classification Search
CPC ........ G06F 3/044; G06F 3/045; G06F 3/0488; G06F 3/04883; G06F 3/07886; G06F 3/0412; G06F 3/0414; G06F 3/0416; G01R 27/2605; G01R 29/12; H05K 3/10; H05K 3/30; H05K 3/4644; G01D 5/24;
(Continued)

(56) References Cited

U.S. PATENT DOCUMENTS

2005/0193822 A1    9/2005  Amano et al.
2009/0039449 A1*   2/2009  Chou ................. G06K 9/00053
                                                    257/415
(Continued)

FOREIGN PATENT DOCUMENTS

CN    101663558 A    3/2010
TW    201437875 A    10/2014
(Continued)

*Primary Examiner* — Thang Le
(74) *Attorney, Agent, or Firm* — Muncy, Geissler, Olds & Lowe, P.C.

(57) ABSTRACT

A composite substrate sensor device comprises: a first substrate sensing chip having an upper surface, a lower surface, side surfaces and scanning and receiving circuit cells; a second substrate connected to the first substrate sensing chip; an insulating layer set comprising insulating layers and disposed on upper surfaces of the second substrate and the first substrate sensing chip on a virtual common plane; scanning and receiving electrode cells disposed on an upper surface of the insulating layer set on a physical common plane substantially parallel to the virtual common plane; and scanning and receiving wires formed on the insulating layer set and electrically connecting the scanning and receiving electrode cells to the scanning and receiving circuit cells, respectively, so that the receiving circuit cells sense an electric field variation of an object through the receiving electrode cells and receiving wires. A method of manufacturing the sensor device is also provided.

17 Claims, 12 Drawing Sheets

(51) Int. Cl.
*G06F 3/044* (2006.01)
*H01L 23/538* (2006.01)
*G06K 9/00* (2006.01)

(58) Field of Classification Search
CPC .. G01D 5/2415; G01D 5/2412; G01D 5/2417; H01H 11/005; H01H 11/0056; H01L 2924/01079; H01L 2924/01078
USPC ........... 324/457, 658–661, 686, 688, 750.17; 345/173, 174
See application file for complete search history.

(56) References Cited

U.S. PATENT DOCUMENTS

| | | | |
|---|---|---|---|
| 2009/0309180 A1 | 12/2009 | Yamagata et al. | |
| 2011/0007030 A1* | 1/2011 | Mo | G06F 3/044 345/174 |
| 2013/0193988 A1* | 8/2013 | Benkley, III | G06K 9/0002 324/658 |
| 2013/0271388 A1* | 10/2013 | Chu | G06F 3/0412 345/173 |
| 2014/0140588 A1* | 5/2014 | Chou | G06K 9/0002 382/124 |
| 2014/0209357 A1 | 7/2014 | Lebens et al. | |
| 2014/0341448 A1 | 11/2014 | Chiu | |
| 2014/0369573 A1 | 12/2014 | Chiu | |
| 2015/0161430 A1* | 6/2015 | Saito | A61B 5/1172 324/691 |
| 2015/0254491 A1 | 9/2015 | Mo et al. | |
| 2016/0104024 A1* | 4/2016 | Slogedal | G06K 9/0002 324/649 |

FOREIGN PATENT DOCUMENTS

| | | |
|---|---|---|
| TW | 201445699 A | 12/2014 |
| TW | M491209 U | 12/2014 |
| TW | 201501264 A | 1/2015 |
| TW | M500929 U | 5/2015 |
| TW | M500931 U | 5/2015 |
| TW | 201535349 A | 9/2015 |

\* cited by examiner

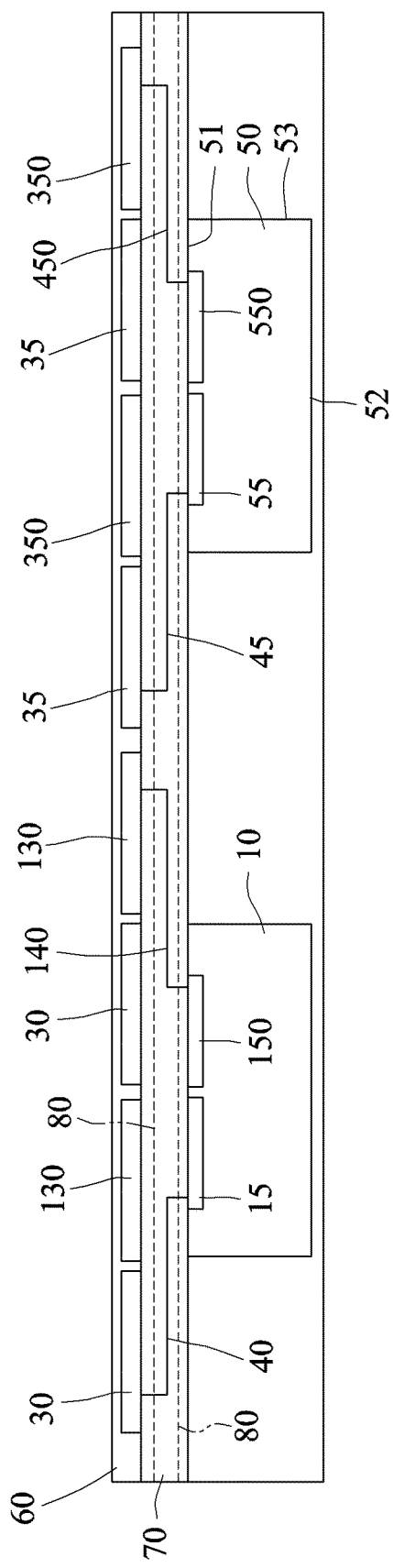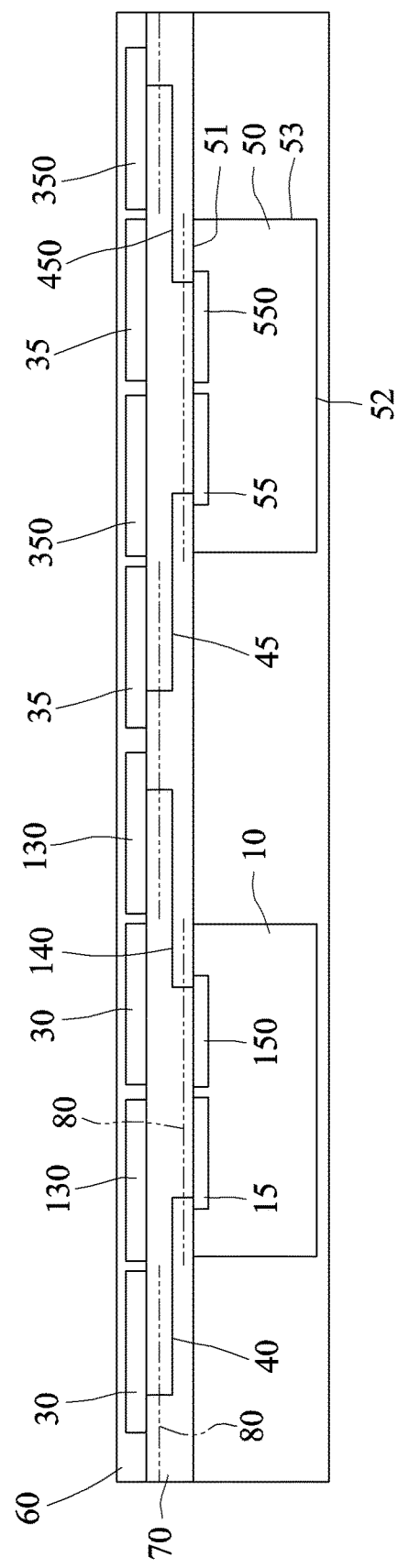
FIG. 7A
FIG. 7B

COMPOSITE SUBSTRATE SENSOR DEVICE AND METHOD OF MANUFACTURING SUCH SENSOR DEVICE

This application claims priorities of Nos. 104111876 and 104133458 filed in Taiwan R.O.C. on Apr. 14, 2015, and Oct. 13, 2015, respectively, under 35 USC 119, the entire contents of which are hereby incorporated by reference.

BACKGROUND OF THE INVENTION

Field of the Invention

The invention relates in general to an electric field sensor array device and a method of manufacturing the same, and more particularly to a composite substrate sensor device and a method of manufacturing the same.

Description of the Related Art

A conventional non-optical type sensor array device, such as an electric field/capacitive, a thermal or a pressure sensing device applied to a fingerprint sensor, needs to sense the textures of the finger, and thus needs to have the essentially enough sensing area contacting the finger to obtain the sufficient sensing accuracy. For example, an electric field/capacitive fingerprint sensor has sensing members arranged in an array, wherein an area covered by these sensing members is the same as the sampled area of the finger. For example, in a fingerprint sensor with the resolution of 500 DPI, a pitch of the sensing members of the sensing device is equal to about 50 microns (um), and each sensing member comprises a sensing electrode cell and a corresponding sensing circuit cell thereinbelow, which are usually integrated in a semiconductor integrated circuit (IC) device, which is fabricated by a complementary metal oxide semiconductor (CMOS) manufacturing process, for example. The sensing electrode cells are formed on a top metal layer of the manufacturing process to define the pitch of the sensing members, while the corresponding sensing circuit cell is formed below or under the sensing electrode cell to form a monolithic configuration. However, when such a monolithic configuration is applied to an area sensor, the dimension of the sensing electrode cell array and its corresponding sensing circuit cell array must be equal to the dimension of the sensing area. That is, the conventional electrode cell and circuit cell have the same pitch dimension, so that the sensing area is equal to the area of the sensing members. For example, if the sensing array has 100×100 sensing members, then the 5 mm×5 mm sensing electrode cell area and the 5 mm×5 mm sensing circuit cell area thereunder need to be provided. If the peripheral analog and digital circuits are added, then the overall area of the fingerprint sensor or chip is very large, so that the device cost is relatively high.

Therefore, how to reduce the area of the sensing members while keeping the equivalent large sensing area is an innovation to be proposed.

SUMMARY OF THE INVENTION

It is therefore an object of the invention to provide a sensor device with the reduced area of the scanning circuit cells and the equivalent large sensing area, and a method of manufacturing the same.

To achieve the above-identified object, the invention provides a composite substrate sensor device, comprising: a first substrate sensing chip having an upper surface, a lower surface, side surfaces connected to the upper surface and the lower surface, and scanning circuit cells and receiving circuit cells disposed below the upper surface; a second substrate connected to one or multiple ones of the side surfaces of the first substrate sensing chip; an insulating layer set comprising insulating layers and disposed on an upper surface of the second substrate and the upper surface of the first substrate sensing chip, wherein the upper surface of the second substrate and the upper surface of the first substrate sensing chip are disposed on a virtual common plane; scanning electrode cells and receiving electrode cells disposed on an upper surface of the insulating layer set, wherein the upper surface of the insulating layer set is disposed on a physical common plane, and the virtual common plane is substantially parallel to the physical common plane; and scanning wires and receiving wires partially or entirely formed in the insulating layer set, wherein each of the scanning wires electrically connects one of rows of the scanning electrode cells to a corresponding one of the scanning circuit cells, each of the receiving wires electrically connects one of columns of the receiving electrode cells to a corresponding one of the receiving circuit cells, and the scanning circuit cells output one or multiple scanning signals to the scanning electrode cells, so that the receiving circuit cells sense an electric field variation of an approaching object through the receiving electrode cells and the receiving wires.

The invention also provides a method of manufacturing a composite substrate sensor device. The method comprises the steps of: providing a first substrate sensing chip, the first substrate sensing chip having an upper surface, a lower surface, side surfaces connected to the upper surface and the lower surface, and scanning circuit cells and receiving circuit cells disposed below the upper surface; providing a second substrate connected to one or multiple ones of the side surfaces of the first substrate sensing chip; forming an insulating layer set comprising insulating layers, wherein scanning wires and receiving wires are partially or entirely disposed in the insulating layer set above an upper surface of the second substrate and the upper surface of the first substrate sensing chip; and forming scanning electrode cells and receiving electrode cells on an upper surface of the insulating layer set. Each of the scanning wires electrically connects one of rows of the scanning electrode cells to a corresponding one of the scanning circuit cells, each of the receiving wires electrically connects one of columns of the receiving electrode cells to a corresponding one of the receiving circuit cells, and the scanning circuit cells output one or multiple scanning signals to the scanning electrode cells so that the receiving circuit cells sense an electric field variation of an approaching object through the receiving electrode cells and the receiving wires.

With the device and method of the invention, a small-area sensing chip can be used to manufacture a composite substrate sensor device for sensing the fingerprint. Therefore, the manufacturing cost of the fingerprint sensor device can be lowered. In addition, since the lateral electric field is used to sense the fingerprint, the total number of the receiving circuit cells and the scanning circuit cells is much smaller than that of the receiving electrode cells and the scanning electrode cells. So, the dimension and thus the cost of the first substrate sensing chip can be effectively reduced.

Further scope of the applicability of the present invention will become apparent from the detailed description given hereinafter. However, it should be understood that the detailed description and specific examples, while indicating preferred embodiments of the present invention, are given by way of illustration only, since various changes and modifications within the spirit and scope of the present invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention.

FIGS. 7A and 7B are schematic front views showing two examples according to a fourth embodiment of the invention.

DETAILED DESCRIPTION OF THE INVENTION

The present invention will be apparent from the following detailed description, which proceeds with reference to the accompanying drawings, wherein the same references relate to the same elements.

In each embodiment of the invention, a sensing chip (may be regarded as a first substrate) is embedded into a second substrate, which may be a molding compound in this embodiment, or the sensing chip is connected to one side of the second substrate to form a combination (may be regarded as a composite substrate), on which interconnections and electrodes are formed, so that a composite electric field sensor array device may be formed and applied to a fingerprint sensor device or any device for sensing an electric field variation (especially the lateral electric field variation) of an approaching object. In this invention, the second substrate may comprise, for example but without limitation to, a molding compound substrate, or an arbitrary substrate, such as a semiconductor silicon substrate, or an insulating glass substrate, or the like. Consequently, the sensing chip and the sensing electrode cells are formed in different manufacturing processes. The chip area of the sensing chip can be effectively reduced without changing the effective area dimension of the sensing electrode cell array, and the device cost can be decreased. Furthermore, multiple sensing chips may be integrated according to the technology of each embodiment of the invention to meet various requirements.

Figure 1:
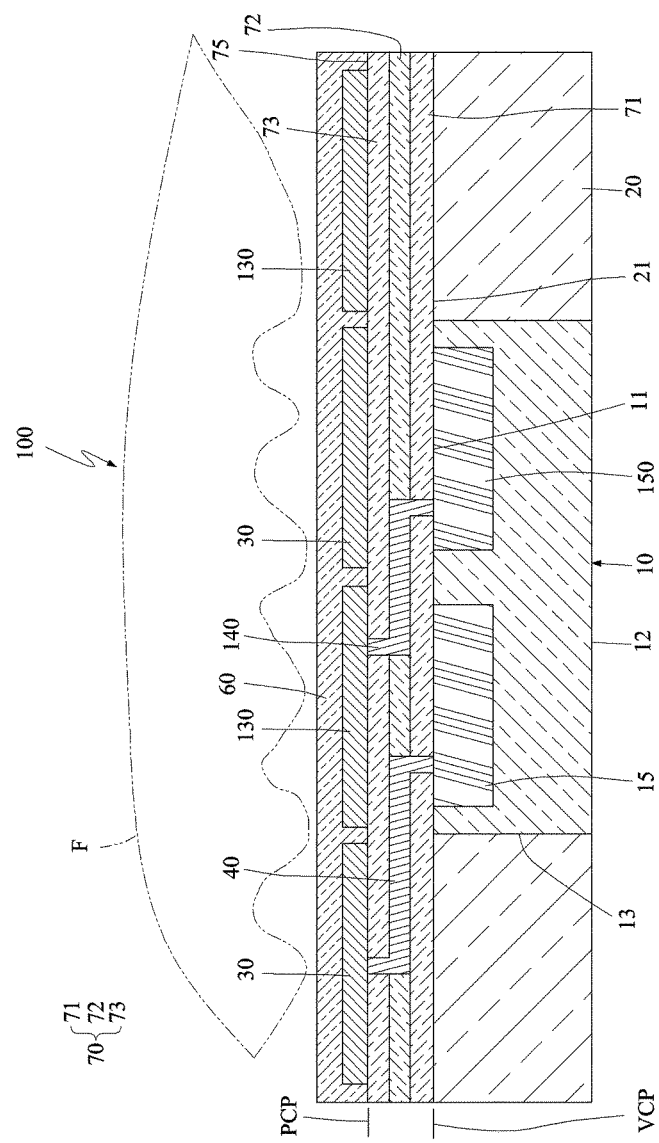
FIG. 1 is a schematically cross-sectional view showing a composite substrate sensor device according to a first embodiment of the invention.
Figure 2:
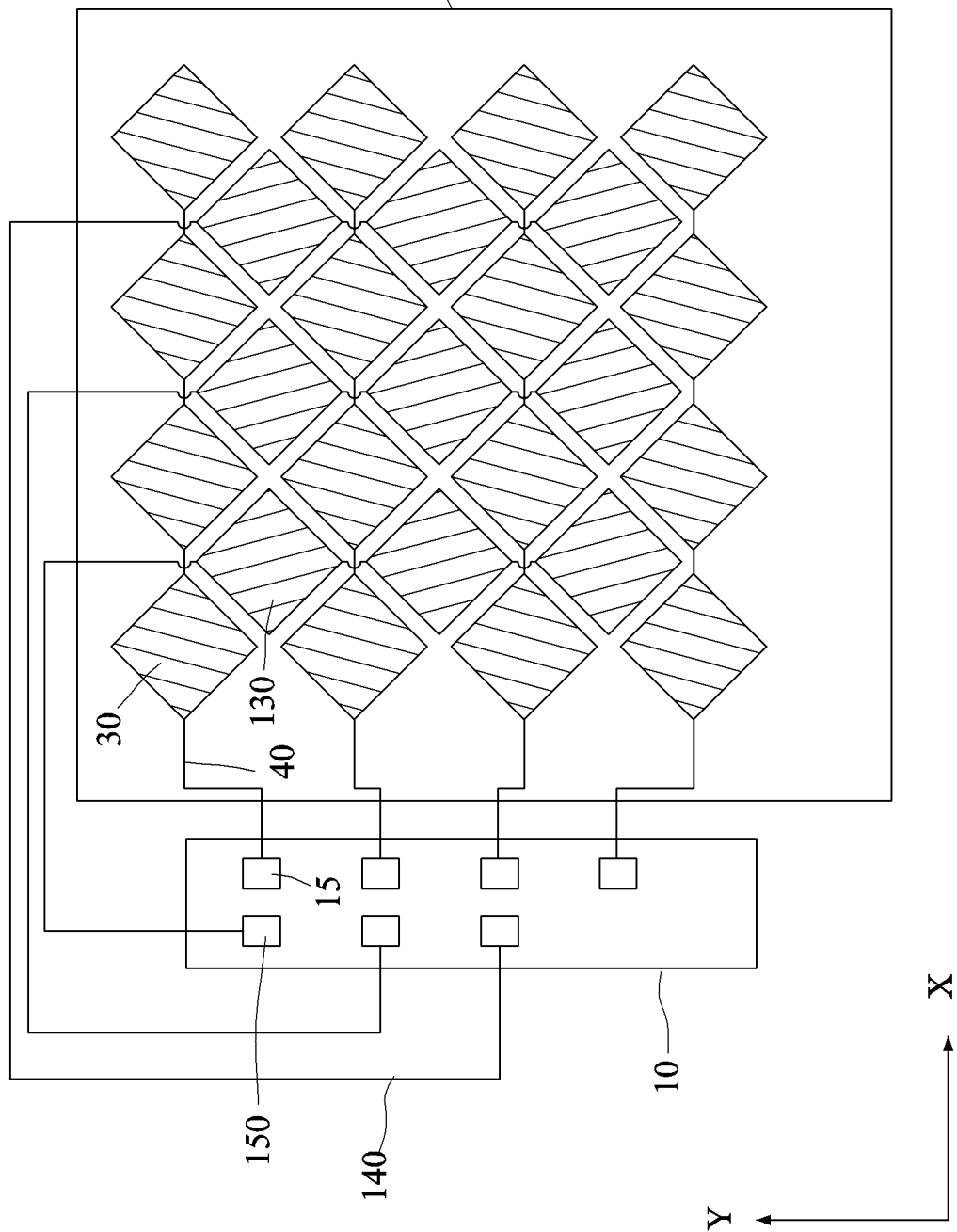
FIG. 2 is a schematic view showing connections according to the first embodiment of the invention.
Figure 3:
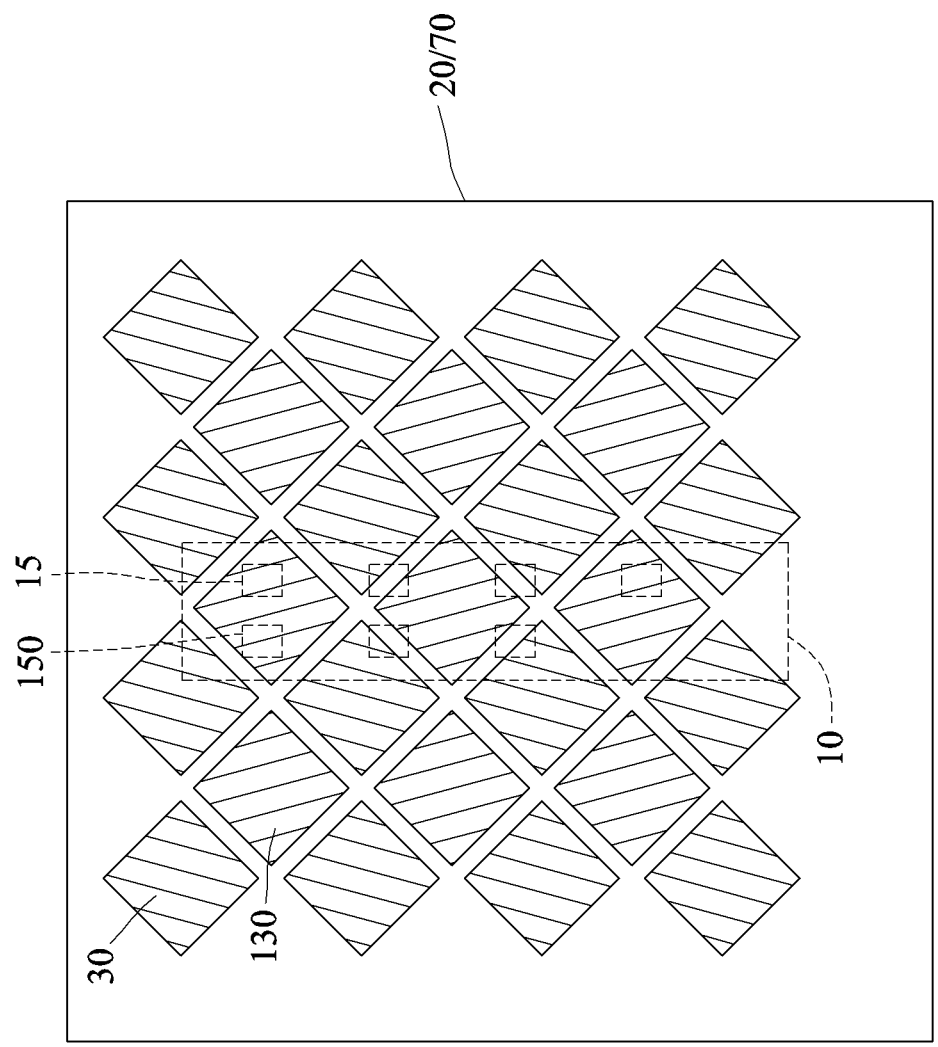
FIG. 3 is a schematic top view showing the first embodiment of the invention.

FIG. 1 is a schematically cross-sectional view showing a composite substrate sensor device 100 according to a first embodiment of the invention. FIG. 2 is a schematic view showing connections according to the first embodiment of the invention. FIG. 3 is a schematic top view showing the first embodiment of the invention. It is worth noting that FIG. 1 only schematically displays the connection relationship between the structures, but not completely correspond to FIGS. 2 and 3. In addition, scanning wires and receiving wires are not depicted in FIG. 3.

Referring to FIGS. 1 to 3, the composite substrate sensor device 100 of this embodiment comprises a first substrate sensing chip 10, a second substrate (molding compound layer) 20, an insulating layer set 70, scanning electrode cells 30, receiving electrode cells 130, scanning wires 40 and receiving wires 140.

The first substrate sensing chip 10 has an upper surface 11, a lower surface 12, side surfaces 13 connected to the upper surface 11 and the lower surface 12 and scanning circuit cells 15 and receiving circuit cells 150 disposed below the upper surface 11. These scanning circuit cells 15 may be constituted by one scanning circuit in conjunction with switch units, and may also be independent scanning circuits. These receiving circuit cells 150 may be constituted by one receiving circuit in conjunction with switch units, and may also be independent receiving circuits.

The first substrate sensing chip 10 is embedded into the second substrate 20 to have a common plane. This can completely reduce the thickness of the device, which is completely the same as that of a conventional sensing member array formed using a silicon substrate, and this is very important to the application to the device product, such as a mobile phone. Herein, the second substrate 20 is a molding compound layer surrounding the side surfaces 13 of the first substrate sensing chip 10. The insulating layer set 70 comprising insulating layers (e.g., insulating layers 71, 72 and 73) are disposed on an upper surface 21 of the molding compound layer 20 and the upper surface 11 of the first substrate sensing chip 10. The upper surface 21 of the molding compound layer 20 and the upper surface 11 of the first substrate sensing chip 10 are disposed on a virtual common plane VCP. In another embodiment, the second substrate is connected to one of the side surfaces of the first substrate sensing chip. For example, the first substrate sensing chip 10 of FIG. 1 is moved leftward or rightward to the left boundary or the right boundary as long as the right surface or left surface of the first substrate sensing chip can be connected to the molding compound layer 20. That is, the second substrate may directly contact one of the side surfaces of the first substrate sensing chip.

The scanning electrode cells 30 and the receiving electrode cells 130 are disposed on an upper surface 75 of the insulating layer set 70 and disposed orthogonally in the vertical and horizontal directions. The upper surface 75 of the insulating layer set 70 is disposed on a physical common plane PCP. The virtual common plane VCP is substantially parallel to the physical common plane PCP, and separated from the physical common plane PCP by a distance being a vertical height of the insulating layer set 70. In this embodiment, the scanning electrode cells 30 and the receiving electrode cells 130 are uniformly distributed over the first substrate sensing chip 10 and the second substrate 20, so that the physical area of the first substrate sensing chip 10 is minimized without sacrificing a physical sensing area of the composite substrate sensor device 100 (the exposed contacting area with the finger). In another embodiment, the scanning electrode cells 30 and the receiving electrode cells 130 are non-uniformly distributed over the first substrate sensing chip 10 and the second substrate 20. In still another embodiment, the scanning electrode cells 30 and the receiving electrode cells 130 are disposed only above the first substrate sensing chip 10 or the second substrate 20.

The scanning wires 40 and the receiving wires 140 are partially or entirely formed in the insulating layer set 70. Each scanning wire 40 electrically connects one of rows of the scanning electrode cells 30 to a corresponding one of the scanning circuit cells 15 (e.g., one scanning wire 40 electrically connects one scanning circuit cell 15 thereabove to one row of four scanning electrode cells 30 thereabove). Each receiving wire 140 electrically connects one of columns of the receiving electrode cells 130 to a corresponding one of the receiving circuit cells 150 (e.g., one receiving wire 140 electrically connects one receiving circuit cell 150 thereabove to one left column of three receiving electrode cells 130). The scanning circuit cells 15 output one or multiple scanning signals to the scanning electrode cells 30, so that the receiving circuit cells 150 sense an electric field variation of an approaching object through the receiving electrode cells 130 and the receiving wires 140. In a non-restrictive example of this embodiment, the fingerprint of a finger F is sensed because the interference of the ridge or valley of the finger F on the receiving electrode cell abutting upon the scanning electrode cell can be calculated according to the electric field variation, so that the information regarding the difference between the ridges or valleys of the finger F can be obtained. In this illustrative but non-limitative embodiment, one row of scanning electrode cells 30 are electrically connected together, and one column of receiving electrode cells 130 are electrically connected together.

In this embodiment, multiple scanning circuit cells 15 constitute a scanning circuit cell array, wherein the number of the scanning circuit cells 15 is equal to the number of the scanning electrode cells 30. In another embodiment, one scanning circuit cell 15 may correspond to many scanning wires 40 and many scanning electrode cells 30, so that the number of the scanning circuit cells 15 and the area of the first substrate sensing chip may be further reduced; or one scanning circuit cell 15 may correspond to many scanning wires and one scanning electrode cell to prevent the failed wire from affecting the product yield. In addition, many receiving circuit cells 150 constitute a receiving circuit cell array. The number of the receiving circuit cells 150 is equal to the number of the receiving electrode cells 130. In another embodiment, one receiving circuit cell 150 may correspond to many receiving wires 140 and many receiving electrode cells 130, so that the number of the receiving circuit cells 150 and the area of the first substrate sensing chip may be further reduced; or one receiving circuit cell 150 may correspond to many receiving wires and one receiving electrode cell to prevent the failed wire from affecting the product yield. In addition, the scanning electrode cells 30 and the receiving electrode cells 130 constitute a scan receiving electrode cell array. Heretofore, another important characteristic of the invention only needs one-dimensional linear receiving circuit cells 150 to configure a two-dimensional sensing array element, and this is never disclosed. Of course, the geometric arrangement of FIG. 2 of this embodiment is provided only for the purpose of illustrating the characteristic of the invention without restricting the invention thereto.

In addition, the composite substrate sensor device 100 may further comprise a device protection layer 60, disposed on the insulating layer set 70, the scanning electrode cells 30 and the receiving electrode cells 130. The device protection layer 60 and the finger F directly or indirectly contact with each other to protect the scanning electrode cells 30 and the receiving electrode cells 130. The protection layer may be constituted by one single material or multiple layers of materials. Because the first substrate sensing chip 10 and the second substrate 20 function as two substrates, this embodiment is referred to as the composite substrate sensor device 100. The scanning electrode cells 30, the receiving electrode cells 130, the scanning wires 40 and the receiving wires 140 are disposed above the first substrate sensing chip 10 and the second substrate 20. That is, when the scanning electrode cells 30, the receiving electrode cells 130, the scanning wires 40, the receiving wires 140, the scanning circuit cells 15 and the receiving circuit cells 150 are orthogonally projected onto the virtual common plane VCP or the physical common plane PCP, the covering range of the scanning wires 40 covers the covering range of the scanning circuit cells 15, and/or the covering range of the scanning electrode cells 30 covers the covering range of the scanning circuit cells 15, and/or the covering range of the receiving wires 140 covers the covering range of the receiving circuit cells 150, and/or the covering range of the receiving electrode cells 130 covers the covering range of the receiving circuit cells 150.

Figure 4:
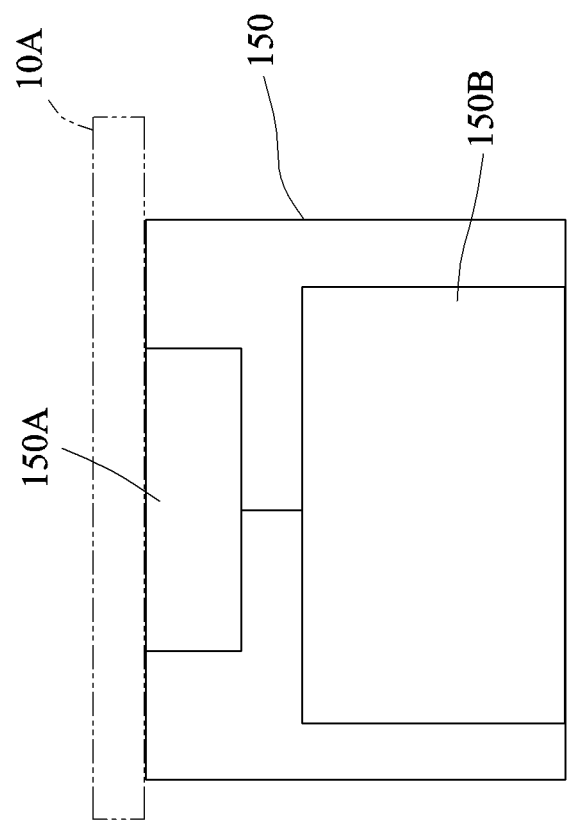
FIG. 4 is a schematic view showing a receiving circuit cell according to the first embodiment of the invention.

FIG. 4 is a schematic view showing the receiving circuit cell 150 according to the first embodiment of the invention. Referring to FIG. 4, the receiving circuit cell 150 comprises a transmission electrode 150A and a receiving-circuit-cell physical portion 150B electrically connected to the transmission electrode 150A. The transmission electrode 150A is electrically connected to the receiving wire 140 to function for signal transmission. The transmission electrode 150A is electrically connected to the receiving wire 140 to function for the signal transmission. In one example, the receiving-circuit-cell physical portion 150B may comprise partial or whole circuits including a front-end sensing circuit, an analog-to-digital converting circuit, a gain amplifier circuit, an operational amplifier and the similar circuits. It is worth noting that when the receiving circuit cell 150 is not combined with the second substrate (molding compound layer) 20, a chip protection layer 10A may cover the transmission electrode 150A because many first substrate sensing chips 10 may be formed on a wafer and then diced and packaged. Thus, the chip protection layer 10A may protect the transmission electrode 150A.

Referring again to FIG. 1, the insulating layer set 70 of this embodiment is constituted by three insulating layers. In another embodiment, the insulating layer set 70 may be constituted by four or more than four insulating layers. This depends on the skills of wire layout. When the ratio of the horizontal area of the scanning circuit cell 15 to the horizontal area of the scanning electrode cell 30 gets smaller, the required insulating layers get more.

Referring to FIGS. 2 and 3, the scanning circuit cells 15 are arranged into a one-dimensional first array, the scanning electrode cells 30 and the receiving electrode cells 130 are arranged into a two-dimensional second array, and the second array has an X-axis and a Y-axis perpendicular to each other. That is, the scanning wires 40 and the receiving wires 140 have the one-dimensional or two-dimensional fan-out expanding from the scanning circuit cells 15 to the scanning electrode cells 30.

Figure 5:
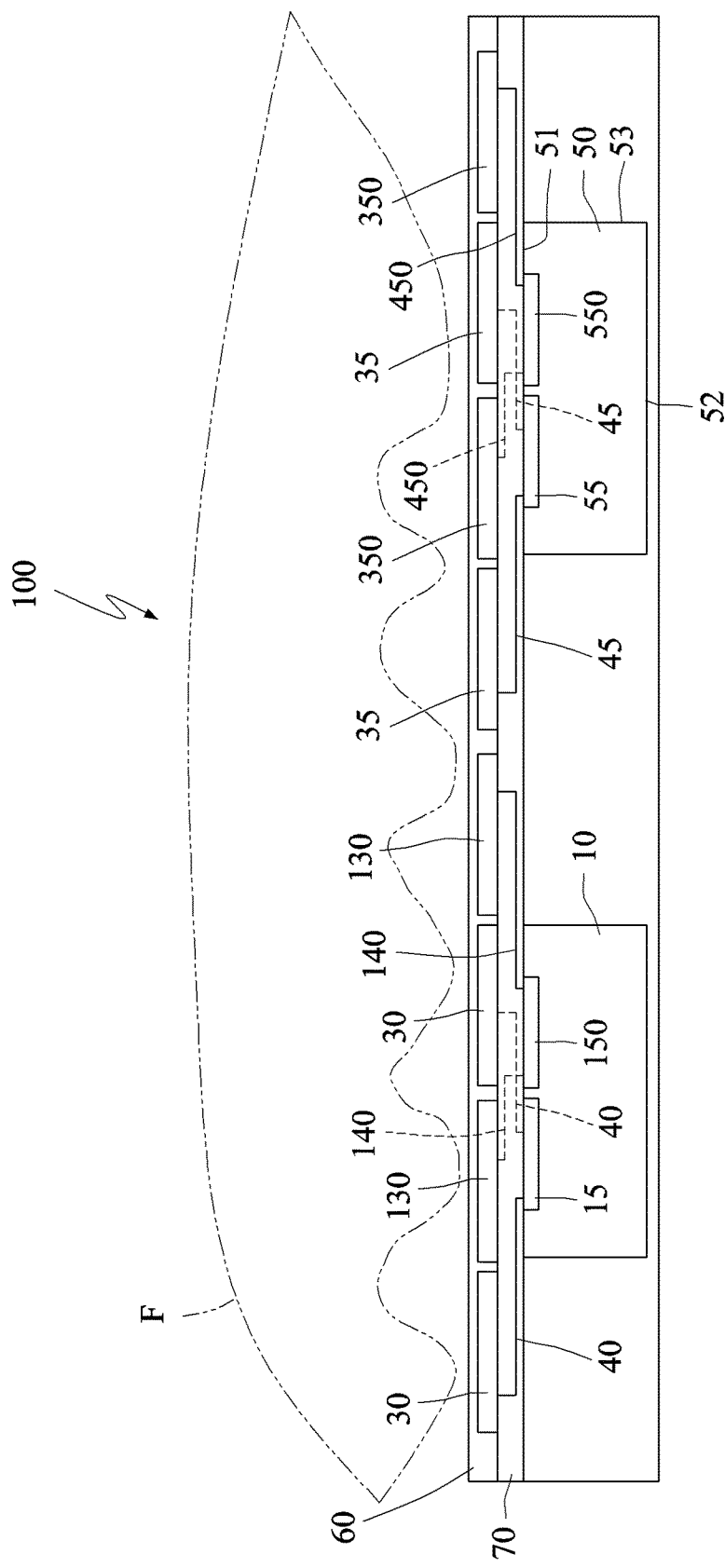
FIG. 5 is a schematic front view showing a second embodiment of the invention.

FIG. 5 is a schematic front view showing a second embodiment of the invention. Referring to FIG. 5, the composite substrate sensor device 100 of this embodiment is similar to the first embodiment except that this embodiment further comprises a second substrate sensing chip 50, second scanning electrode cells 35, second receiving electrode cells 350, second scanning wires 45 and second receiving wires 450.

The second substrate sensing chip 50 has an upper surface 51, a lower surface 52, side surfaces 53 connected to the upper surface 51 and the lower surface 52 and second scanning circuit cells 55 and second receiving circuit cells 550 disposed below the upper surface 11 of the second substrate sensing chip 50. The molding compound layer 20 is connected to one or multiple ones of the side surfaces 53 of the second substrate sensing chip 50 (surrounds the side surfaces 53 of the second substrate sensing chip 50 in this embodiment), wherein the connection is the direct connection. The insulating layer set 70 is disposed on the upper surface 21 of the molding compound layer 20, the upper surface 11 of the first substrate sensing chip 10 and the upper surface 51 of the second substrate sensing chip 50. The second scanning electrode cells 35 and the second receiving electrode cells 350 are disposed on the upper surface 75 of the insulating layer set 70 and the upper surface 11 of the second substrate sensing chip 50. The second scanning wires 45 and the second receiving wires 450 are partially or entirely formed in the insulating layer set 70. Each second scanning wire 45 electrically connects one of rows of the second scanning electrode cells 35 to a corresponding one of the second scanning circuit cells 55. Each second receiving wire 450 electrically connects one of columns of the second receiving electrode cells 350 to a corresponding one of the second receiving circuit cells 550. The second scanning circuit cells 55 output one or multiple second scanning signals to the second scanning electrode cells 35, so that the second receiving circuit cells 550 sense the fingerprint of the finger F through the second receiving electrode cells 350 and the second receiving wires 450 in conjunction with the receiving circuit cell 150.

In this embodiment, the second substrate sensing chip 50 and the first substrate sensing chip 10 may have the same function and dimension, and the second substrate sensing chip 50 and the first substrate sensing chip 10 are actually electrically connected together (not shown) through, for example, a power supply or synchronous clock. In addition, the data of one of them may be transmitted to the other one of them, which will transmit the merged data to the outside, wherein different designs may be regarded as for the system design and data transmission between independent chips. However, the most important characteristic of the invention is to create the maximum physical sensing area with the smallest chip area. Consequently, the sensing chip may be manufactured in a mass production manner and used as a standard sensing chip. When the designer needs multiple sensing chips to complete the composite substrate sensor device, multiple sensing chips can be used. In another embodiment, the second substrate sensing chip 50 and the first substrate sensing chip 10 may have different functions and dimensions, and be used as two standard elements to be selected by the designer. It is worth noting that in the second substrate sensing chip 50 and the first substrate sensing chip 10, not all scanning circuit cells need to be connected to the scanning electrode cells, and not all receiving circuit cells need to be connected to the receiving electrode cells, so that the designer requirement is satisfied.

Figure 6:
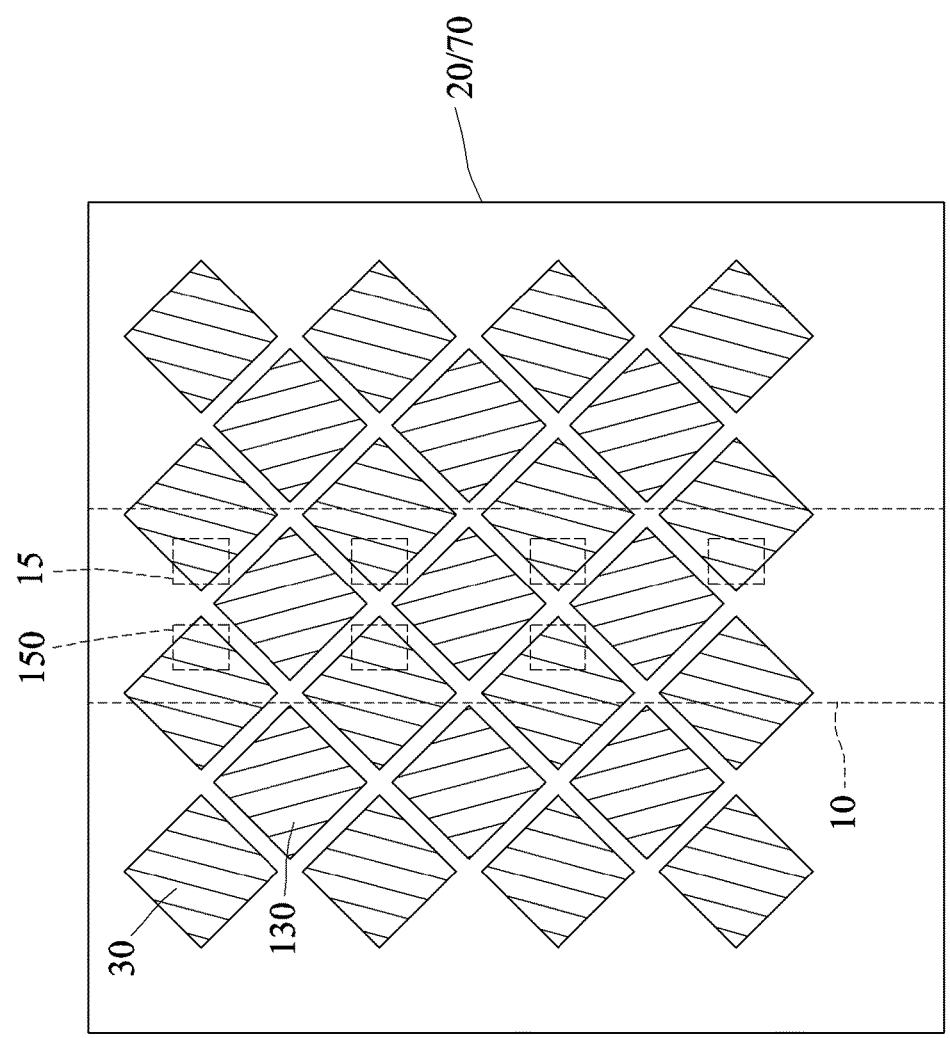
FIG. 6 is a schematic top view showing a third embodiment of the invention.

FIG. 6 is a schematic top view showing a third embodiment of the invention. Referring to FIG. 6, this embodiment is similar to the first embodiment except that the wires 40 have the one-dimensional expansion (only expand outwards in the X-axis direction) from the scanning circuit cells 15 to the scanning electrode cells 30. The advantage is that the first substrate sensing chip 10 may be made to be longitudinal, and the only one-dimensional expanded interconnections are simpler. According to FIGS. 4 and 6, another characteristic of the invention is that the electrode sensing members are designed to be distributed over the first and the second substrates to minimize the geometric area of the sensing chip without sacrificing the physical sensing area (the exposed contacting area with the finger). Of course, the spirit of this embodiment may also contain that the scanning electrode cell is only disposed above the second substrate.

FIGS. 7A and 7B are schematic front views showing two examples according to a fourth embodiment of the invention. Referring to FIG. 7A, this embodiment is similar to the second embodiment except that the composite substrate sensor device further comprises two electroconductive partitioning layers 80, which are disposed under the receiving electrode cells 130 and between the receiving electrode cells 130 and the receiving circuit cells 150, and coupled to a constant potential (e.g., 5V, 3.3V or ground potential etc.) for isolating the receiving electrode cell 130 and the receiving circuit cell 150 from the first substrate sensing chip 10 and the second substrate. The electroconductive partitioning layers 80 are disposed on the same plane. It is worth noting that the electroconductive partitioning layers 80 are not electrically connected to the wires 40, 140, 45 and 145, and that only one electroconductive partitioning layer 80 can achieve the isolation effect. It is to be noted that one of the electroconductive partitioning layers 80 may be omitted without affecting the isolating effect of the invention. So, in another embodiment, there could be only one electroconductive partitioning layer 80. As shown in FIG. 7B, this example is similar to FIG. 7A except that the electroconductive partitioning layers 80 are disposed on two different level planes, and may partially overlap or do not overlap with each other when being orthogonally projected onto the horizontal plane. It is to be noted that the electroconductive partitioning layers 80 may also be regarded as one electroconductive partitioning layer.

Figure 8:
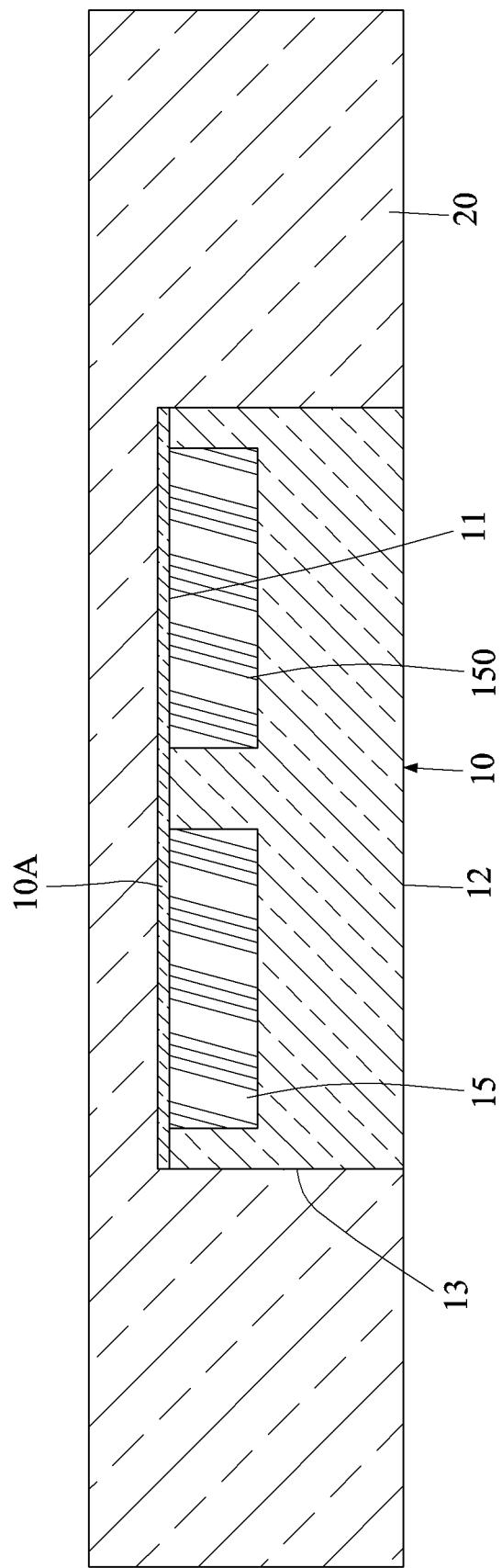
FIGS. 8 and 9 are schematically cross-sectional views showing structures of the steps of the manufacturing method of the first embodiment.
Figure 9:
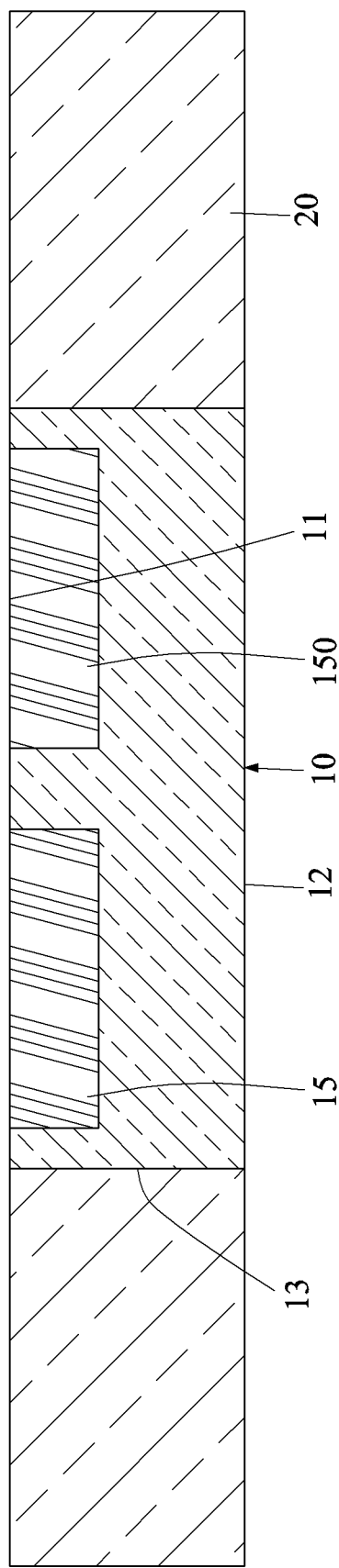

FIGS. 8 and 9 are schematically cross-sectional views showing structures of the steps of the manufacturing method of the first embodiment. Referring to FIGS. 8 and 9, the method of manufacturing the composite substrate sensor device 100 comprises the following steps. First, as shown in FIG. 8, the first substrate sensing chip 10 is provided, wherein the first substrate sensing chip 10 has an upper surface 11, a lower surface 12, side surfaces 13 connected to the upper surface 11 and the lower surface 12 and scanning circuit cells 15 and receiving circuit cells 150 disposed below the upper surface 11. The first substrate sensing chip 10 is manufactured from a silicon wafer through semiconductor manufacturing processes, for example. The chip protection layer 10A may also be formed on the first substrate sensing chip 10. Of course, in other examples, the chip protection layer 10A may be omitted.

Then, the molding compound layer 20 is provided to surround the side surfaces 13 of the first substrate sensing chip 10 or to be connected to one or multiple ones of the side surfaces 13. The molding compound layer 20 also covers the first substrate sensing chip 10 and the chip protection layer 10A. The details will be described in the following. First, the first substrate sensing chip 10 is placed into a mold (not shown), and the molding compound layer 20 is poured to surround the side surfaces 13 of the first substrate sensing chip 10, the upper surface 11 and the lower surface 12, as shown in FIG. 8. Then, a grinding back process is performed to remove the molding compound layer 20, disposed above the upper surface 11 of the first substrate sensing chip 10, to expose the scanning circuit cell 15 and the receiving circuit cell 150, especially the transmission electrode 150A of the receiving circuit cell 150, as shown in FIGS. 9 and 4. That is, performing a grinding back process step is to remove the chip protection layer 10A disposed on the first substrate sensing chip 10 until the transmission electrode 150A of the receiving circuit cell 150 is exposed. Of course, the removing process may also be stopped at the chip protection layer 10A, and the transmission electrode 150A may be exposed by the typical lithography technology.

It is worth noting that in another embodiment, the molding compound layer 20 may be provided and connected to one or multiple ones of the side surfaces 13 by pouring the second substrate 20 connected to one of the side surfaces 13, the upper surface 11 and the lower surface of the first substrate sensing chip 10, and then performing a grinding back process to remove the second substrate 20 disposed on the upper surface 11 of the first substrate sensing chip 10.

Next, as shown in FIG. 1, the insulating layer set 70 comprising the insulating layers 71, 72 and 73 is formed above the upper surface 21 of the molding compound layer 20 and the upper surface 11 of the first substrate sensing chip 10, and the scanning wires 40 and receiving wires 140 are partially or entirely disposed in the insulating layer set 70. The wires 40 and the insulating layers 71, 72 and 73 may be formed by processes comprising, for example but without limitation to, electroplating, etching, depositing and the like, wherein the processes are particularly compatible with the wiring forming processes of the semiconductor manufacturing processes. Because those skilled in the art can easily understand how to implement this technology, detailed descriptions thereof will be omitted.

Then, as shown in FIG. 1, the scanning electrode cells 30 and the receiving electrode cells 130 are formed on the upper surface 75 of the insulating layer set 70, wherein each scanning wire 40 electrically connects one of rows of the scanning electrode cells 30 to a corresponding one of the scanning circuit cells 15, and each receiving wire 140 electrically connects one of columns of the receiving electrode cells 130 to a corresponding one of the receiving circuit cells 150. The scanning circuit cells 15 output one or multiple scanning signals to the scanning electrode cells 30. Thus, the receiving circuit cells 150 can sense the fingerprint of the finger F through the receiving electrode cells 130 and the receiving wires 140. Of course, the device protection layer 60 may be formed on the insulating layer set 70, the scanning electrode cells 30 and the receiving electrode cells 130, wherein the device protection layer 60 and the finger F directly or indirectly contact with each other. The device protection layer 60 is preferably composed of a wear-resistant material. Of course, the device protection layer 60 may also comprise different colors of coating layers. Alternatively, another insulating layer substrate (e.g., sapphire substrate) may cover the device protection layer 60 to prevent it from being scratched by a finger nail or a foreign object.

Figure 10:
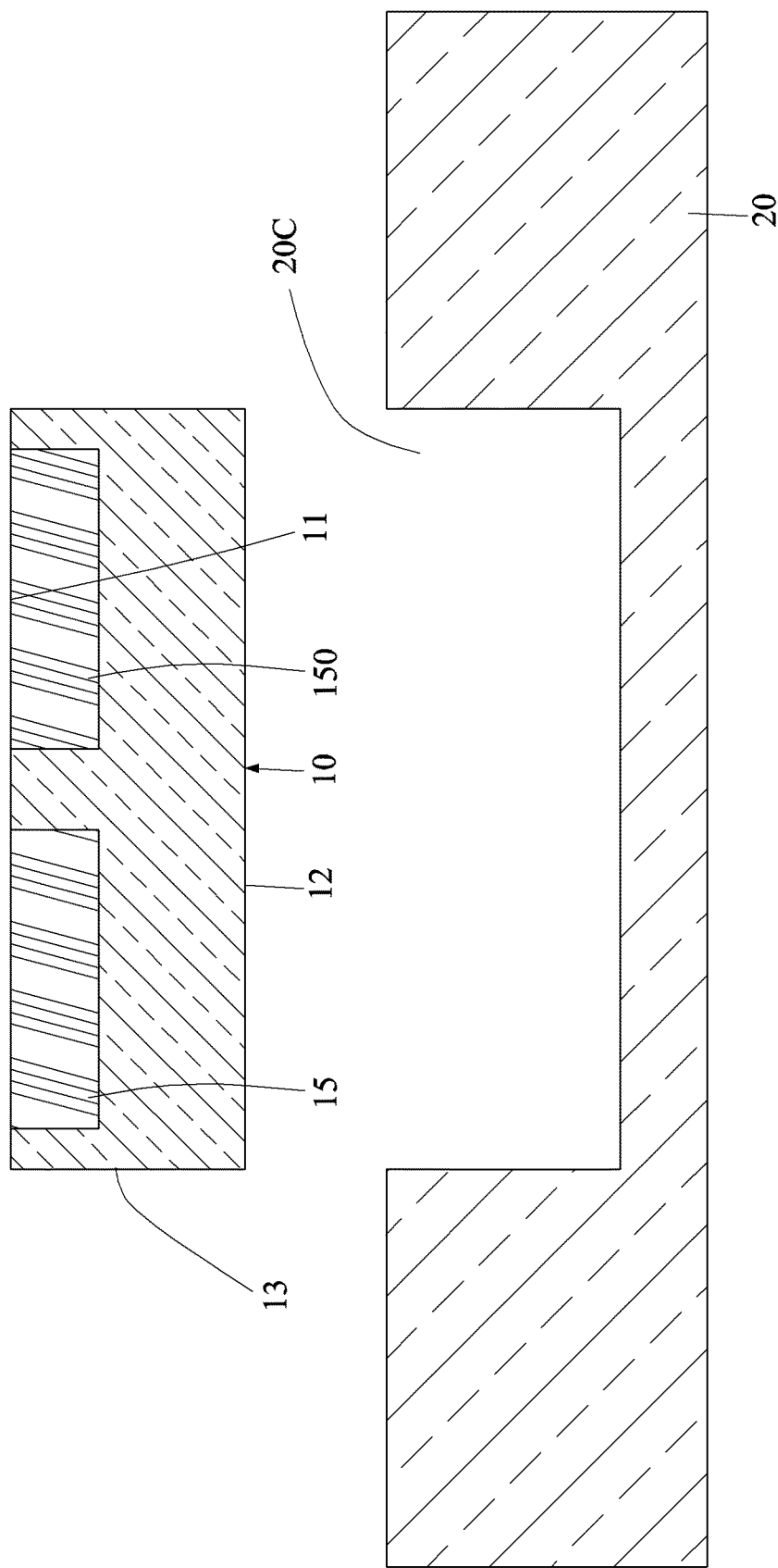
FIG. 10 is a schematically cross-sectional view showing another example of the manufacturing method of the first embodiment.

Of course, the above-mentioned manufacturing processes are described for the purpose of making those skilled in the art be able to implement this invention, but the spirit of the invention is not restricted thereto. For example, FIG. 10 is a schematically cross-sectional view showing another example of the manufacturing method of the first embodiment. The second substrate 20 may also be an arbitrary substrate like the semiconductor or insulator, such as a glass substrate or the like, and may be manufactured by firstly defining a geometric slot 20C with the dimensions the same as or slightly larger than the first substrate sensing chip 10 on the second substrate 20, embedding the first substrate sensing chip 10 into the second substrate 20, and then performing integration by the processes of FIGS. 8 and 9 to manufacture the insulating layer set 70, the wires 40, the array of the scanning electrode cells 30 and the device protection layer 60. It is worth noting that the slot 20C of FIG. 10 does not penetrate through the second substrate 20. So, the grinding process may be performed to remove the bottom layer portion of the second substrate 20 after the first substrate sensing chip 10 is embedded into the second substrate 20 to obtain the structure of FIG. 9. Of course, the slot 20C penetrating through the second substrate 20 may also be directly provided, and then the first substrate sensing chip 10 is embedded into the second substrate 20 to obtain the structure of FIG. 9. Alternatively, the bottom layer portion of the second substrate 20 needs not to be removed in another example.

Figure 11A:
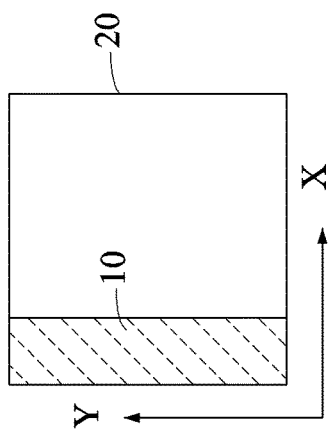
FIGS. 11A to 11G are schematic views showing various configurations of the first substrate sensing chips and the second substrates.
Figure 11B:
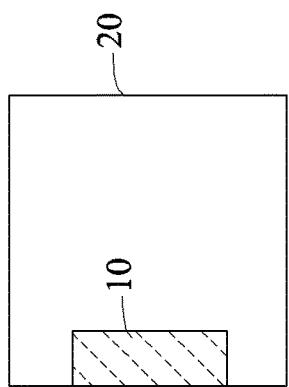
Figure 11C:
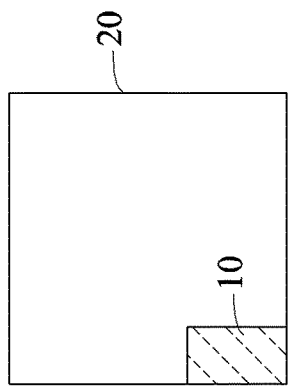
Figure 11D:
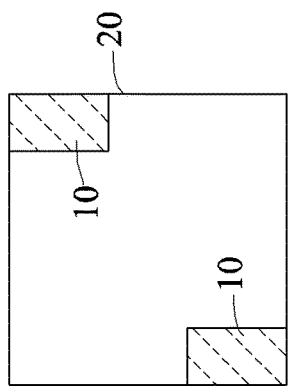
Figure 11E:
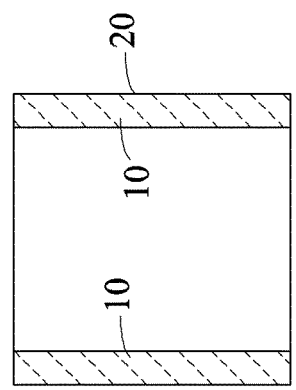
Figure 11F:
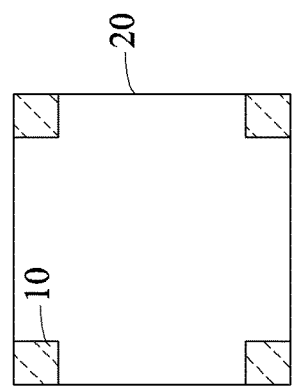
Figure 11G:
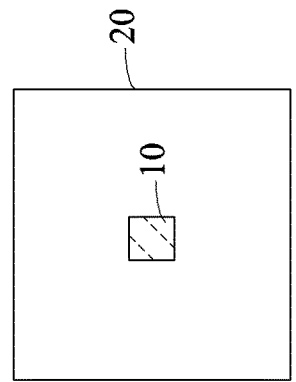

FIGS. 11A to 11G are schematic views showing various configurations of the first substrate sensing chips and the second substrates. Referring to FIG. 11A, the first substrate sensing chip 10 is disposed on the left side of the second substrate 20 and has the Y-axis dimension the same as that of the second substrate 20. As shown in FIG. 11B, the X-axis and Y-axis dimensions of the first substrate sensing chip 10 are smaller than those of the second substrate 20. As shown in FIG. 11C, the first substrate sensing chip 10 is disposed at a corner of the second substrate 20. As shown in FIG. 11D, the first substrate sensing chips 10 are disposed at two corners of the second substrate 20. As shown in FIG. 11E, the first substrate sensing chips 10 are disposed on the left side and the right side of the second substrate 20. As shown in FIG. 11F, the first substrate sensing chips 10 are disposed at four corners of the second substrate 20. As shown in FIG. 11G, the first substrate sensing chip 10 is disposed at the central portion of the second substrate 20.

Figure 12:
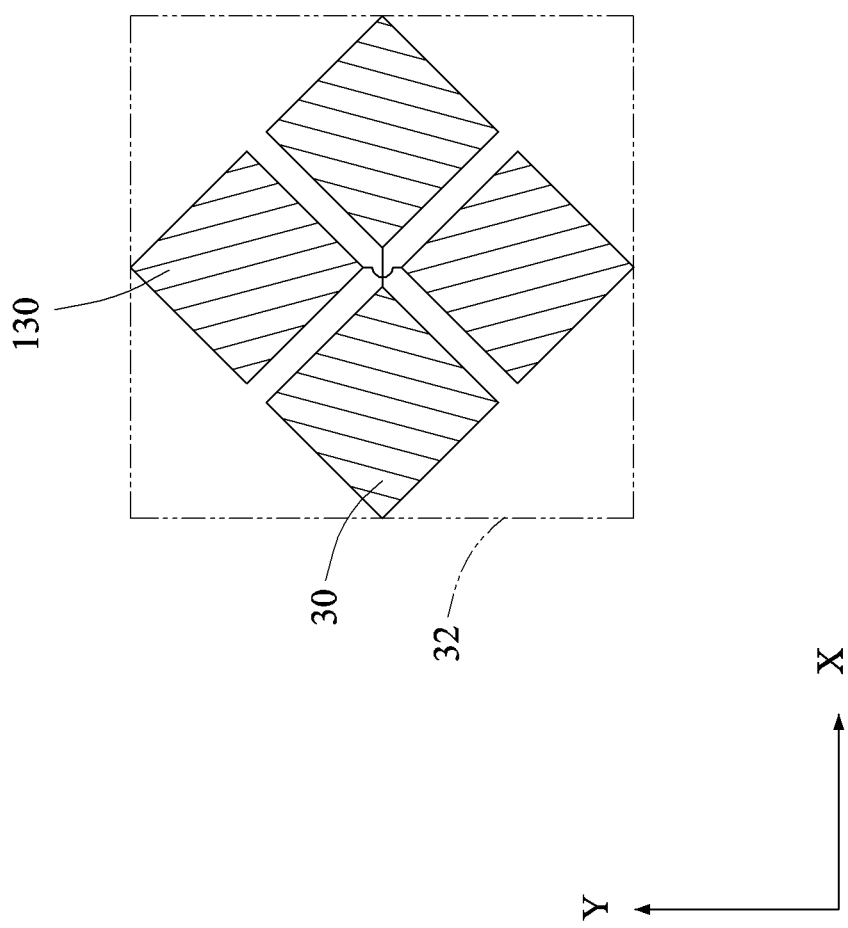
FIG. 12 is a schematic view showing dimensions of one sensing unit of the invention.

FIG. 12 is a schematic view showing dimensions of one sensing unit 32 of the invention. As shown in FIG. 12, neighboring two of the scanning electrode cells 30 and neighboring two of the receiving electrode cells 130 constitute one sensing unit 32. In the embodiment of the invention, the sensing unit 32 is in the form of a square and has a dimension ranging from 20 to 100 microns, preferably from 40 to 60 microns, such as 50 microns corresponding to the resolution of 500 DPI to meet the fingerprint sensing requirement. Due to the requirement of such the high resolution, it is difficult to complete the integral wiring layout by the conventional organic substrate manufacturing and chip bonding packaging technology. This is also the characteristic of the invention, in which the technology of manufacturing the wafer-level composite substrate is adopted, the composite substrate may be regarded as a typical silicon wafer, and the semiconductor lithography technology of the silicon wafer is adopted to form the high-resolution scanning and receiving circuitry layout above the wafer-level composite substrate. Such the configuration is not mentioned and disclosed in the prior art.

With each embodiment of the invention, a small-area sensing chip can be used to manufacture a composite substrate sensor device for sensing the fingerprint. Therefore, the manufacturing cost of the fingerprint sensor device can be lowered. In addition, since the lateral electric field is used to sense the fingerprint, the total number of the receiving circuit cells and the scanning circuit cells is much smaller than that of the receiving electrode cells and the scanning electrode cells. So, the dimension and thus the cost of the first substrate sensing chip can be effectively reduced.

While the present invention has been described by way of examples and in terms of preferred embodiments, it is to be understood that the present invention is not limited thereto. To the contrary, it is intended to cover various modifications. Therefore, the scope of the appended claims should be accorded the broadest interpretation so as to encompass all such modifications.

What is claimed is:

1. A composite substrate sensor device, comprising:
    a first substrate sensing chip having an upper surface, a lower surface, side surfaces connected to the upper surface and the lower surface, and scanning circuit cells and receiving circuit cells disposed below the upper surface;
    a second substrate connected to one or multiple ones of the side surfaces of the first substrate sensing chip;
    an insulating layer set comprising insulating layers and disposed on an upper surface of the second substrate and the upper surface of the first substrate sensing chip, wherein the upper surface of the second substrate and the upper surface of the first substrate sensing chip are disposed on a virtual common plane;
    scanning electrode cells and receiving electrode cells disposed on an upper surface of the insulating layer set, wherein the upper surface of the insulating layer set is disposed on a physical common plane, and the virtual common plane is substantially parallel to the physical common plane; and
    scanning wires and receiving wires partially or entirely formed in the insulating layer set, wherein each of the scanning wires electrically connects one of rows of the scanning electrode cells to a corresponding one of the scanning circuit cells, each of the receiving wires electrically connects one of columns of the receiving electrode cells to a corresponding one of the receiving circuit cells, the scanning circuit cells output one or multiple scanning signals to the scanning electrode cells, so that the receiving circuit cells sense an electric field variation of an approaching object through the receiving electrode cells and the receiving wires.

2. The composite substrate sensor device according to claim 1, further comprising:
    a second substrate sensing chip having an upper surface, a lower surface, side surfaces connected to the upper surface and the lower surface, and second scanning circuit cells and second receiving circuit cells disposed below the upper surface of the second substrate sensing chip, wherein the second substrate is connected to one or multiple ones of the side surfaces of the second substrate sensing chip, and the insulating layer set is disposed on the upper surface of the second substrate, the upper surface of the first substrate sensing chip and the upper surface of the second substrate sensing chip;
    second scanning electrode cells and second receiving electrode cells disposed on the upper surface of the insulating layer set and the upper surface of the second substrate sensing chip; and
    second scanning wires and second receiving wires partially or entirely formed in the insulating layer set, wherein each of the second scanning wires electrically connects one of rows of the second scanning electrode cells to a corresponding one of the second scanning circuit cells, each of the second receiving wires electrically connects one of columns of the second receiving electrode cells to a corresponding one of the second receiving circuit cells, the second scanning circuit cells output one or multiple second scanning signals to the second scanning electrode cells, so that the second receiving circuit cells sense the electric field variation of the approaching object through the second receiving electrode cells and the second receiving wires in conjunction with the receiving circuit cells.

3. The composite substrate sensor device according to claim 1, wherein the insulating layer set comprises three insulating layers.

4. The composite substrate sensor device according to claim 1, wherein the scanning circuit cells are arranged into a one-dimensional first array, and the scanning electrode cells and the receiving electrode cells are arranged into a two-dimensional second array.

5. The composite substrate sensor device according to claim 1, further comprising a device protection layer disposed on the insulating layer set and the scanning electrode cells and the receiving electrode cells, wherein the device protection layer directly or indirectly contacts with the object.

6. The composite substrate sensor device according to claim 1, wherein the scanning electrode cells and the receiving electrode cells are distributed over the first substrate sensing chip and the second substrate, so that a physical area of the first substrate sensing chip is minimized without sacrificing a physical sensing area of the composite substrate sensor device.

7. The composite substrate sensor device according to claim 1, further comprising an electroconductive partitioning layer, which is disposed under the receiving electrode cells, is coupled to a constant potential, and isolates the receiving electrode cells and the receiving circuit cells from the first substrate sensing chip and the second substrate.

8. The composite substrate sensor device according to claim 1, wherein the second substrate surrounds the side surfaces of the first substrate sensing chip.

9. The composite substrate sensor device according to claim 1, wherein the second substrate directly contacts one of the side surfaces of the first substrate sensing chip.

10. The composite substrate sensor device according to claim 1, wherein neighboring two of the scanning electrode cells and neighboring two of the receiving electrode cells constitute one sensing unit having a dimension ranging from 20 to 100 microns.

11. A method of manufacturing a composite substrate sensor device, the method comprising steps of:
    (a) providing a first substrate sensing chip, the first substrate sensing chip having an upper surface, a lower surface, side surfaces connected to the upper surface and the lower surface, and scanning circuit cells and receiving circuit cells disposed below the upper surface;
    (b) providing a second substrate connected to one or multiple ones of the side surfaces of the first substrate sensing chip;
    (c) forming an insulating layer set comprising insulating layers, wherein scanning wires and receiving wires are partially or entirely disposed in the insulating layer set above an upper surface of the second substrate and the upper surface of the first substrate sensing chip; and
    (d) forming scanning electrode cells and receiving electrode cells on an upper surface of the insulating layer set, wherein each of the scanning wires electrically connects one of rows of the scanning electrode cells to a corresponding one of the scanning circuit cells, each of the receiving wires electrically connects one of columns of the receiving electrode cells to a corresponding one of the receiving circuit cells, and the scanning circuit cells output one or multiple scanning signals to the scanning electrode cells so that the receiving circuit cells sense an electric field variation of an approaching object through the receiving electrode cells and the receiving wires.

12. The method according to claim 11, wherein the step (b) comprises:
   (b1) pouring the second substrate to surround the side surfaces of the first substrate sensing chip, the upper surface and the lower surface; and
   (b2) performing a grinding back process to remove the second substrate disposed above the upper surface of the first substrate sensing chip.

13. The method according to claim 12, wherein the step (b) is performed to remove a chip protection layer disposed on the first substrate sensing chip until transmission electrodes of the receiving circuit cells are exposed.

14. The method according to claim 11, further comprising a step of:
   (e) forming a device protection layer on the insulating layer set, the scanning electrode cells and the receiving electrode cells, wherein the device protection layer directly or indirectly contacts with the object.

15. The method according to claim 11, wherein the step (b) comprises:
   forming a slot on the second substrate; and
   placing the first substrate sensing chip into the slot.

16. The method according to claim 11, wherein the step (b) comprises:
   (b1) pouring the second substrate connected to one of the side surfaces of the first substrate sensing chip, the upper surface and the lower surface; and
   (b2) performing a grinding back process to remove the second substrate disposed above the upper surface of the first substrate sensing chip.

17. The method according to claim 11, wherein neighboring two of the scanning electrode cells and neighboring two of the receiving electrode cells constitute one sensing unit having a dimension ranging from 20 to 100 microns.

* * * * *